United States Patent [19]

Baik-Hee

[11] Patent Number: 5,034,818
[45] Date of Patent: Jul. 23, 1991

[54] PRIORITY SELECTOR FOR EXTERNAL SIGNALS

[75] Inventor: Han Baik-Hee, Suwon, Rep. of Korea

[73] Assignee: SamSung Electronics Co., Ltd., Suwon, Rep. of Korea

[21] Appl. No.: 377,076

[22] Filed: Jul. 10, 1989

[51] Int. Cl.⁵ .................................... H04N 5/268
[52] U.S. Cl. ................... 358/181; 455/166; 340/825.5; 328/104; 307/241
[58] Field of Search .................. 358/181; 455/166; 340/825.5, 825.51; 328/104; 307/243; 370/112

[56] References Cited

U.S. PATENT DOCUMENTS

| | | | |
|---|---|---|---|
| 3,702,898 | 11/1972 | Webb | 358/181 |
| 3,783,307 | 1/1974 | Breuer | 307/243 |
| 4,191,856 | 3/1980 | Nagano et al. | 307/243 |
| 4,363,033 | 12/1982 | Lovely | 358/181 |
| 4,460,918 | 7/1984 | Flasza | 358/181 |
| 4,521,810 | 6/1985 | Nigborowiz | 358/181 |
| 4,572,967 | 2/1986 | Metz | 328/104 |
| 4,581,645 | 4/1986 | Beyer, Jr. | 358/181 |
| 4,638,181 | 1/1987 | Deiss | 328/104 |

FOREIGN PATENT DOCUMENTS

| | | | |
|---|---|---|---|
| 0075177 | 1/1985 | Japan | 358/181 |
| 0176377 | 1/1985 | Japan | 358/181 |
| 0119474 | 5/1990 | Japan | |

Primary Examiner—Howard W. Britton
Assistant Examiner—Michael H. Lee
Attorney, Agent, or Firm—Robert E. Bushnell

[57] ABSTRACT

The invention provides a priority selector for external signals having a tri-mode converting circuit with a switching part, wherein a TV signal or external signals are selected by operating a converting switch of the switching integrated circuit in response to fast blanking (F/B) signal, and a priority-giving part, wherein one of the external signals is selected by converting the converting switch of the switching integrated circuit in response to the fast blanking (F/B) signal. Simplifying the circuit may be possible since the priority is given by the switching voltage, and reducing the cost of the product and improving the quality of the product may be attained.

20 Claims, 1 Drawing Sheet

PRIORITY SELECTOR FOR EXTERNAL SIGNALS

BACKGROUND OF THE INVENTION

The present invention relates to a priority selector for external signals, particularly a selector which can provide a priority for two external signals consisting of red, green, and blue (R, G, B). Generally, the faculty of TV is more and more diversified.

In the past, the external signals are selected by an external jack in the TV, however, this is complicated since each mode must be directly selected, also the interference phenomenon between external signals and the cross-talk phenomenon between external signals and television signals occur when two external signals enter.

SUMMARY OF THE INVENTION

The present invention has been made in consideration of this and has for one object to provide a priority selector for external signals in which a priority is given by switching components when external signals enter, the interference phenomenon between TV signal and two external signals can be prevented by carrying out the converting operation between a TV signal and two external signals, thus a clean screen can be obtained.

According to the present invention, there is provided a priority selector for external signals having a tri-mode converting circuit including: a switching part, wherein the TV signal or external signals is selected by converting the switch of the switching integrated circuit by an entered fast blanking (F/B) signal, and a priority-giving part, wherein one of the external signals is selected by converting the converting switch of the switching integrated circuit by the entered fast blanking (F/B) signal.

DETAILED DESCRIPTION OF THE INVENTION

The present invention will be now described in more detail with reference to the accompanying drawing.

Figure 1:
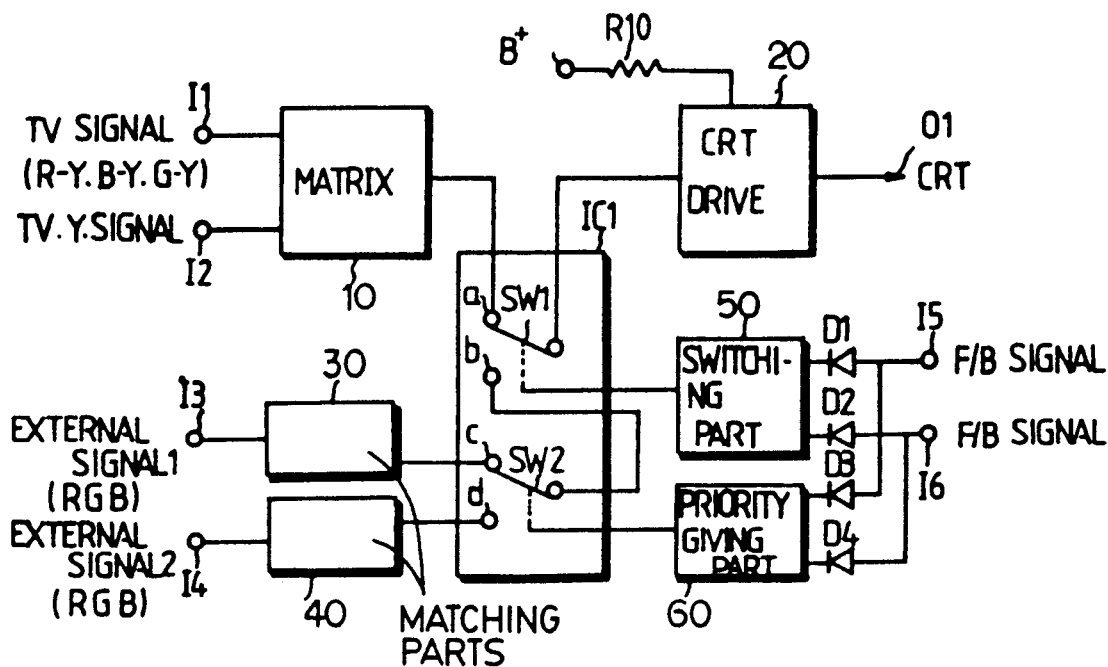
FIG. 1 is an overall diagram of one embodiment constructed according to the principles of the present inventions.

FIG. 1 is a overall configuration of the present invention, where the applied TV signal (R-Y, B-Y and G-Y) and the Y signal of TV to input terminals I1 and I2, respectively, are provided to a terminal a of a converting switch SW1 included in the switching integrated circuit IC2 through a matrix 10, and the applied external signals R, G, B of external signal land 2 applied input ports I3 and I4 are provided to terminals c and d of a converting switch stage SW2 included in the switching integrated circuit IC2 through a matching part 30 and 40, next, the applied fast blanking (F/B) signals to input ports I5 and I6 convert the converting switches SW1, and SW2 through diodes D1-D4, the switching part 50, and the priority-giving part 60, thereby carrying out the operation for the TV signal and the external signals 1 and 2 through a CRT driver.

Figure 2:
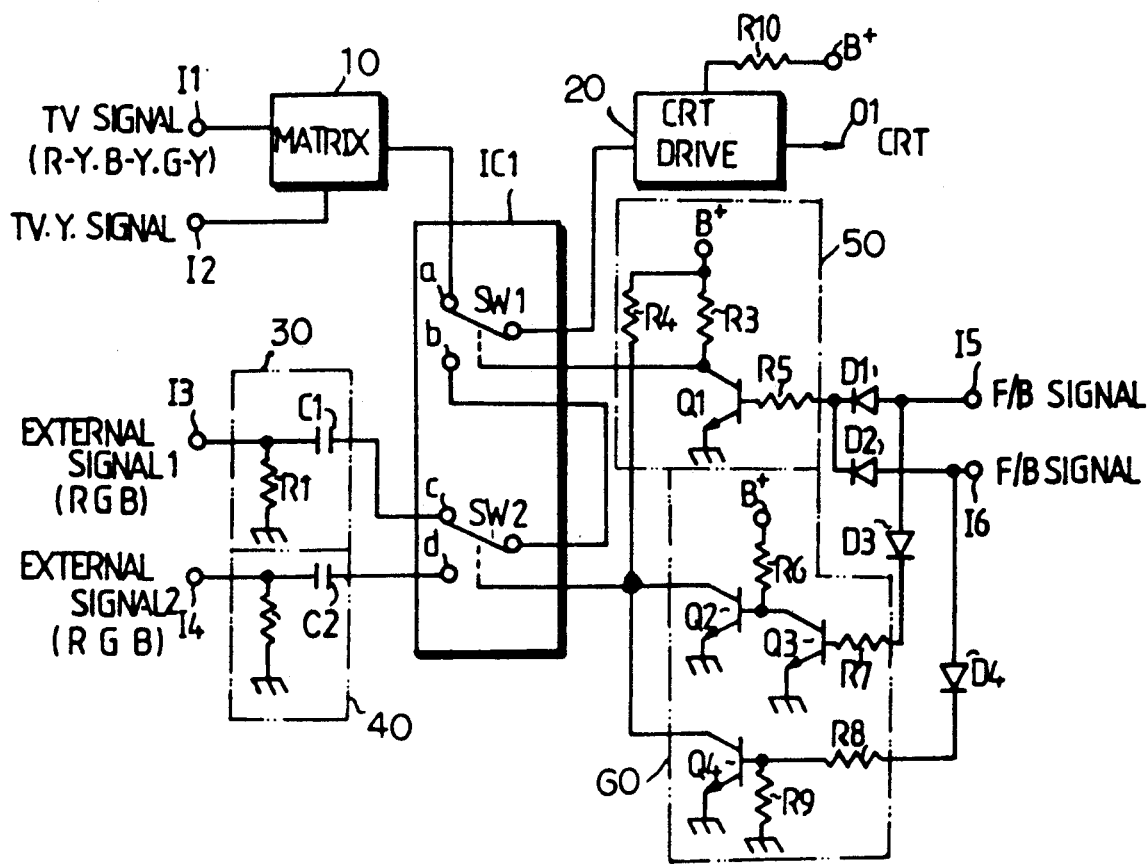
FIG. 2 is a circuit diagram showing particular details of one embodiment.

FIG. 2 is a circuit diagram of the present invention, where the matrix 10 selects the TV signal (R-Y, B-Y and G-Y) and the Y signal of the TV applied to the input terminals I1 and I2 and provides to the terminal a of the converting switch SW1, included in the switching stage IC2, and the matching parts 30 and 40 which has resistors R1 and R2 and coupling condensors C1 and C2, respectively, and which transmit external signals 1 and 2 to the terminals c and d of the converting switch SW2.

In the switching part 50, the applied fast blanking signals to the input terminals I5 and I6 drive a transistor Q1 through diodes D1 and D2 and resistors R3 and R5 convert the TV signals and the external signal applied to the terminals a and b of the converting switch SW1 and the priority-giving part 60 consists as follow, where the fast blanking signal drives transistors Q2-Q4 through each of the diodes D3, D4 and resistors R6-R9, so that the external signals 1 or 2 can be selected, and the CRT driver 20 consists to be driven by the selected signal through the switching integrated circuit IC1, thereby driving the CRT connected to the output terminal O1 via CRT drive 2D. Also R10 is a resistor of the CRT driver for the supply voltage.

To explain the operation of the present invention in detail, it follows.

(1) In selecting the TV signal, the fast blanking signal is not applied to the input terminals I5 and I6, so transistor Q1 turns off since the bias voltage is not also provided to the base of transistor Q1, and the supply voltage B+ provides H-level to the converting switch SW1 and the switch SW1 is connected to the terminal a.

Thus, the TV signal and Y - signal of TV are provided to the CRT driver 20 through the converting switch SW1, thereby carrying out the TV operation.

(2) In selecting the external signal 1, the fast blanking signal is applied to only terminal I5 through the diode D1 and resistor R5, and turns transistor Q1 on, therefore the current flows to a ground through resistor R3 and transistor Q1.

Thus the L-level is provided to the converting switch SW1, thereby connecting to the terminal b.

At the same time, the F/B signal of the input terminal I5 turns the transistor Q3 on through the diode D3 and bias resistor R7, so the transistor Q2 is turned off and the supply voltage B+ provides H-level to the converting switch SW2 through the resistor R4, thereby connecting the switch SW2 to the terminal c.

Thus, the external signal 1 is provided to the CRT driver 20, through the matching part 30, the converting switch SW1, and SW2 carry out the operation of external signal 1 on the CRT monitor.

(3) In selecting external signal 2, the F/B signal is applied to the only terminal I6 and also turns the transistor Q1 on through the diode D2 and resistor R5, thereby connecting the converting switch SW2 to the terminal B as explained before. At the same time the F/B signal turns the transistor Q4 on through the resistors R8 and R9.

Thus, L-level is applied to the converting switch SW2 so that the switch SW2 is connected to the terminal d.

Similarly, the external signal 2 is provided to the CRT driver through the matching part 40, the converting switch SW1 and SW2, carrying out the operation of the external signal 2 on CRT monitor via CRT drive 2D.

Where, if the fast blanking signal is applied to both input terminals I5 and I6 at the same time, the fast blanking turns the transistor Q1 on through the diodes D1, D2 and resistor R5, thereby connecting the converting switch SW1, to the terminal B, and also turns the transistor Q4 on through the diode D4 and the resistors R8 and R9, thereby connecting the converting switch SW2 to the terminal d. (at this time, the transistor Q2 turns off).

Thus, the external signal 2 can be preferentially provided to the CRT driver, thereby carrying out the operation of the external signal 2.

After the external signal 2 is preferentially selected, the converting operation can be carried out by the switching integrated circuit IC1 as described above, so that the interference phenomenon can be prevented. The present invention can be used for a color TV, monitor, and VTR.

As mentioned above, in the present invention after the priority for external signals is given by the switching components, the converting operation is carried out, therefore, it has the effect that the cost of the product can be reduced and the quality of the product can be improved since the priority can be given by the switching voltage in order to simplify the circuit.

The invention is in no way limited to the embodiment described hereinabove. Various modifications of the disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A priority selector circuit, comprising:
   switching means having first and second switching stages, for providing a plurality of input ports connectable to simultaneously receive a television signal and a plurality of external signals, and for providing one of said television signal and plurality of external signals as an output signal;
   a switching part coupled to respond to either of a plurality of input signals, to provide a first control signal to said switching means whereby said television signal or one of said plurality of external signals are selected by operating the first switching stage of the switching means in dependence upon either of said plurality of input signals; and
   a priority-giving part, coupled to respond to said plurality of input signals, to provide a second control signal to said switching means wherein one of the plurality of external signals is selected by operating the second switching stage of the switching means in response to said input signals.

2. A priority selector circuit according to claim 1, wherein the switching part comprises:
   a first transistor;
   a first resistor coupled to a control electrode of said first transistor; and
   a first plurality of diodes each having an input terminal connectable to receive different ones of said plurality of input signals, said first plurality of diodes being coupled to said first transistor through said first resistor.

3. A priority selector circuit according to claim 1, wherein the priority-giving part comprises:
   a plurality of transistors;
   a first plurality of resistors coupled to control electrodes of different ones of said plurality of transistors;
   a first plurality of diodes each having input terminals connectable to receive different ones of said plurality of input signals, each of said first plurality of diodes being coupled to different ones of said plurality of transistors through different ones of said first plurality of resistors.

4. A priority selector circuit according to claim 2, wherein the priority-giving part comprises:
   a plurality of second transistors;
   a plurality of second resistors coupled to control electrodes of different ones of said plurality of second transistors;
   a second plurality of diodes each coupled to different ones of said input terminals to receive different ones of said plurality of input signals, each of said second plurality of diodes being coupled to different ones of said plurality of second transistors through different ones of said plurality of second resistors.

5. A priority selector circuit according to claim 2, wherein the switching part comprises:
   a second resistor connectable between a principal current conducting electrode of said first transistor and a source of electrical potential, said principal current conducting electrode of said first transistor being coupled to provide said first control signal to said switching means; and
   a third resistor connectable between the source of electrical potential and said priority-giving part.

6. A priority selector according to claim 3, wherein said priority-giving part comprises:
   a second resistor connectable between a principal current conducting electrode of a first one of said first plurality of transistors and a source of electrical potential;
   a second transistor having a control electrode coupled to said second resistor and said principal current conducting electrode of said first one of said plurality of transistors; and
   a third resistor connectable between a control electrode of a second one of said plurality of transistors and a reference potential.

7. A priority selector circuit according to claim 6, wherein the switching part comprises:
   a third transistor;
   a fourth resistor coupled to a control electrode of said second transistor; and
   a second plurality of diodes each having an input terminal connectable to receive different ones of said plurality of input signals, said second plurality of diodes being coupled to said third transistor through said a third resistor.

8. A priority selector circuit according to claim 5, wherein the priority-giving part comprises:
   a plurality of second transistors;
   a plurality of fourth resistors coupled to control electrodes of different ones of said plurality of second transistors;
   a second plurality of diodes each coupled to different ones of said input terminals to receive different ones of said plurality of input signals, each of said second plurality of diodes being coupled to different ones of said plurality of second transistors through different ones of said plurality of fourth resistors.

9. A priority selector according to claim 7, wherein said priority-giving part comprises:
   a fifth resistor connectable between a principal current conducting electrode of a second one of said first plurality of transistors and a source of electrical potential;

a third transistor having a control electrode coupled to said fifth resistor and said principal current conducting electrode of said second one of said plurality of transistors; and a sixth resistor connectable between a control electrode of a second one of said second plurality of transistors and a reference potential.

10. A priority selector circuit according to claim 4, wherein the switching part comprises:

a third resistor connectable between a principal current conducting electrode of said first transistor and a source of electrical potential, said principal current conducting electrode of said first transistor being coupled to provide said first control signal to said switching means; and a fourth resistor connectable between the source of electrical potential and said priority-giving part.

11. A priority selector for external signals having a switching device for tri-mode switching of a television broadcast signal and two external signals, and a driver for displaying a selected signal according to the switching device, comprising:

switching means for selecting one of a television broadcast signal and two external signals after switching in dependence upon occurrence of one or a plurality of fast blanking signals; and prioritizing means for selecting either one of said two external signals by switching said switching device in dependence upon the fast blanking signals, and for preferentially selecting one of said two external signals by switching the switching device in response to occurrence of a plurality of the fast blanking signals at the same time.

12. A priority selector according to claim 11, wherein the switching means comprises:

a plurality of diodes connected to each provide a different input terminal for reception of said fast blanking signals; and a transistor connected to cathodes of each of said plurality of diodes, whereby said first transistor is switched between electrically conducting ON and OFF states in dependence upon said fast blanking signals.

13. A priority selector according to claim 11, wherein the prioritizing means comprises:

a first transistor;

a second transistor; and a plurality of diodes each providing a different input terminal for reception of said fast blanking signals, and each of said plurality of diodes having a cathode connected to a control electrode of a different one of said first and second transistors to switch said first and second transistors between electrically conducting ON and OFF states in dependence upon said fast blanking signals.

14. A priority selector according to claim 11, wherein:

the switching means comprises:

a first plurality of diodes connected to each provide a different one of a plurality of input terminals for reception of said fast blanking signals; and a first transistor connected to cathodes of each of said first plurality of diodes, whereby said first transistor is switched between electrically conducting ON and OFF states in dependence upon said fast blanking signals; and the prioritizing means comprises:

a second transistor;

a third transistor; and a second plurality of diodes each coupled to a different one of said input terminals for reception of said fast blanking signals, and each of said second plurality of diodes having a cathode connected to a control electrode of a different one of said second and third transistors to switch said second and third transistors between electrically conducting ON and OFF states in dependence upon said fast blanking signals.

15. A priority selector according to claim 11, wherein:

the switching means comprises:

a first plurality of diodes connected to each provide a different one of a plurality of input terminals for reception of said fast blanking signals; and first control means connected to cathodes of each of said first plurality of diodes, for controlling transmission of a first switching signal to said switching device in dependence upon said fast blanking signals conducted by said first plurality of diodes;

the prioritizing means comprises:

a second plurality of diodes each coupled to a different one of said input terminals;

second control means coupled to a cathode of a first one of said second plurality of diodes, for controlling transmission of a second switching signal to said switching device in dependence upon said fast blanking signals conducted by said first one of said second plurality of diodes;

third control means coupled to a cathode of a second one of said second plurality of diodes, for controlling transmission of a third switching signal to said switching device in dependence upon said fast blanking signals conducted by said second one of said second plurality of diodes; and means connectable to a source of electrical potential, for applying said source of electrical potential to said first, second and third control means.

16. A priority selector circuit providing priority of selection between signals, comprising:

switching means for selecting between one of a first video signal and one of second or third video signals in dependence upon first state of occurrence of a plurality of fast blanking signals; and prioritizing means for selecting either one of said second and third video signals in dependence upon second and third states of occurrence of the plurality of fast blanking signals, and for preferentially selecting one of said two external second and third signals in response a fourth state of occurrence of said plurality of the fast blanking signals.

17. A priority selector according to claim 18, wherein the switching means comprises:

a plurality of diodes connected to each provide a different input terminal for reception of said fast blanking signals; and a transistor connected to cathodes of each of said plurality of diodes, whereby said first transistor is switched between electrically conducting ON and OFF states in dependence upon said fast blanking signals.

18. A priority selector according to Claim 18, wherein said selection means comprises:

a first transistor;

a second transistor; and a plurality of diodes each providing a different input terminal for reception of said fast blanking signals, and each of said plurality of diodes having a cathode connected to a control electrode of a different one of said first and second transistors to switch said first and second transistors between electrically conducting ON and OFF states in dependence upon said fast blanking signals.

19. A priority selector according to claim 18, wherein: the switching means comprises:

a first plurality of diodes connected to each provide a different one of a plurality of input terminals for reception of said fast blanking signals; and a first transistor connected to cathodes of each of said first plurality of diodes, whereby said first transistor is switched between electrically conducting ON and OFF states in dependence upon said fast blanking signals; and the said selecting means comprises:

a second transistor;

a third transistor; and a second plurality of diodes each coupled to a different one of said input terminals for reception of said fast blanking signals, and each of said second plurality of diodes having a cathode connected to a control electrode of a different one of said second and third transistors to switch said second and third transistors between electrically conducting ON and OFF states in dependence upon said fast blanking signals.

20. A priority selector according to claim 18, wherein: the switching means comprises:

a first plurality of diodes connected to each provide a different one of a plurality of input terminals for reception of said fast blanking signals; and first control means connected to cathodes of each of said first plurality of diodes, for controlling transmission of a first switching signal to said switching device in dependence upon said fast blanking signals conducted by said first plurality of diodes;

the said selecting part comprises:

a second plurality of diodes each coupled to a different one of said input terminals;

second control means coupled to a cathode of a first one of said second plurality of diodes, for controlling transmission of a second switching signal to said switching device in dependence upon said fast blanking signals conducted by said first one of said second plurality of diodes;

third control means coupled to a cathode of a second one of said second plurality of diodes, for controlling transmission of a third switching signal to said switching device in dependence upon said fast blanking signals conducted by said second one of said second plurality of diodes; and means connectable to a source of electrical potential, for applying said source of electrical potential to said first, second and third control means.

* * * * *

UNITED STATES PATENT AND TRADEMARK OFFICE
CERTIFICATE OF CORRECTION

PATENT NO. : 5,034,818

DATED : July 23, 1991

INVENTOR(S) : Baik-Hee HAN

It is certified that error appears in the above-identified patent and that said Letters Patent is hereby corrected as shown below:

On the title page items [19] and [75]:

Line 2, change the inventor's name "BAIK-HEE" to --HAN--;

Line 5, change the inventor's name "Han Baik-Hee" to --Baik-Hee Han--.

UNITED STATES PATENT AND TRADEMARK OFFICE
CERTIFICATE OF CORRECTION

PATENT NO. : 5,034,818

DATED : July 23, 1991

INVENTOR(S) : Baik-Hee HAN

It is certified that error appears in the above-identified patent and that said Letters Patent is hereby corrected as shown below:

Column 1, Line 47, change "a" to --an--;

Line 52, change "IC2" to --IC1--;

Line 53, change "land" to --1 and--;

Line 56, change "IC2" to --IC1--;

Line 68, change "IC2" to --IC1--;

Column 2, Line 1, change "has" to --have--;

Line 8, change "signals" to --signal--, and change "signal" to --signals--;

Line 10, change "consists as follow" to --is as follows--;

Line 17, change "2D" to --20--;

Line 49, delete "the" (first occurrence);

Line 62, change "2D" to --20--;

Line 67, change "B" to --b--;

Signed and Sealed this

Twenty-second Day of December, 1992

Attest:

DOUGLAS B. COMER

Attesting Officer     Acting Commissioner of Patents and Trademarks